United States Patent [19]

Froeschle

[11] Patent Number: 5,025,885

[45] Date of Patent: Jun. 25, 1991

[54] MULTIPLE CHAMBER LOUDSPEAKER SYSTEM

[75] Inventor: Thomas A. Froeschle, Southboro, Mass.

[73] Assignee: Bose Corporation, Framingham, Mass.

[21] Appl. No.: 379,886

[22] Filed: Jul. 14, 1989

[51] Int. Cl.$^5$ .......... H05K 5/00

[52] U.S. Cl. .......... 181/156; 181/144; 181/150; 181/154; 181/160; 181/163; 181/199; 381/90; 381/154; 381/159

[58] Field of Search .......... 181/144, 150, 156, 160, 181/154, 163, 199; 381/159, 90, 159

[56] References Cited

U.S. PATENT DOCUMENTS

| | | | |
|---|---|---|---|
| 1,969,704 | 8/1934 | D'Alton | 381/159 X |
| 4,112,259 | 9/1978 | Carlsson | 181/154 X |
| 4,549,631 | 10/1985 | Bose | 181/160 X |
| 4,875,546 | 10/1989 | Krnan | 181/160 |

FOREIGN PATENT DOCUMENTS

| | | | |
|---|---|---|---|
| 3144545 | 8/1982 | Fed. Rep. of Germany | 381/159 |
| 3317518 | 11/1984 | Fed. Rep. of Germany | 381/159 |
| 2452224 | 10/1980 | France . | |
| 2470511 | 6/1981 | France | 381/159 |

OTHER PUBLICATIONS

Teledyne Acoustic Research, STC 660 Subwoofer Satellite System, copyright 1988.

*Primary Examiner*—Benjamin R. Fuller
*Assistant Examiner*—Victor DeVito
*Attorney, Agent, or Firm*—Fish & Richardson

[57] ABSTRACT

A loudspeaker system has an enclosure with a baffle dividing the interior into first and second subchambers. The smaller subchamber is directly coupled to the region outside the enclosure by a port tube. The larger subchamber is coupled to the region outside the enclosure via the smaller subchamber by a port tube. The dividing baffle carries a woofer.

9 Claims, 3 Drawing Sheets

MULTIPLE CHAMBER LOUDSPEAKER SYSTEM

BACKGROUND OF THE INVENTION

The present invention relates in general to improving the performance of a loudspeaker system at lower frequencies, and more particularly concerns an improved loudspeaker system characterized by improved performance in the low frequency range that has structure which is relatively easy and inexpensive to fabricate.

A major problem in making a loudspeaker system for low frequency reproduction is obtaining a high output at low frequencies while limiting loudspeaker cone excursions. Typically, loudspeaker topologies are configured such that cone excursions are reasonably within the displacement limits of the attached motor structure such that sonic output is relatively free from audible distortion. The size of the displacement region must be sufficiently limited to keep the cost of manufacturing loudspeakers from becoming excessive.

Many prior art low frequency speaker systems comprise a simple woofer with no enclosure, for example in television and radio sets and some public address systems. A difficulty with these systems is that there is no means for preventing the radiation from the back of the speaker from canceling the radiation from the front. In such a system peak sonic output is limited by the requirement of very large cone excursions at low frequencies.

One prior art approach for reducing back radiation, and cone excursion, is to place the loudspeaker driver in a closed box, forming what is often called an acoustic suspension system. An acoustic suspension system provides a reactance against which the loudspeaker driver work, limiting the cone excursion and also preventing the radiation from the back of the loudspeaker from canceling that from the front.

Although this embodiment provides for increased low frequency output compared to the enclosureless embodiment, the low frequency peak output is still limited by the displacement region limits of the motor structure.

One prior art improvement on the acoustic suspension system is a ported enclosure system. A ported system typically includes a woofer in the enclosure and a port tube serving as a passive radiating means. The air in the port tube provides an acoustic mass that provides system designers with an extra reactance which can be used to tune the loudspeaker response, typically altering the frequency response at the low end. A ported system is characterized by a resonant frequency at which the mass of air in the port reacts with the volume of air in the cabinet to create a resonance (port resonance). At the port resonance the cone excursion of the loudspeaker is minimized. A ported system exhibits improved sensitivity at port resonance and decreased cone excursion. The result of the decreased cone excursion requirements at frequencies near the port resonance is an increase in low frequency peak output and a decrease in distortion when compared to the acoustic suspension systems. Another result of the improved sensitivity at port resonance is often an extension of the lower cutoff frequency of the loudspeaker to a lower value.

A dual-chamber system has also been used to improve the performance of an acoustic suspension system. Such systems are disclosed in U.S. Pat. No. 4,549,631, assigned to the same assignee as the present application, and incorporated by reference herein in its entirety. A dual-chamber system has an enclosure divided into first and second subchambers by a dividing member. The dividing member is formed with an opening which contains a loudspeaker, the loudspeaker being oriented such that one surface of the loudspeaker cone is exposed to the first subchamber, and the other surface of the loudspeaker cone is exposed to the second subchamber.

In some dual-chamber systems, the first and second ports directly couple the first and second subchambers to the region outside of the enclosure. In other systems, the larger subchamber is directly coupled to the region outside of the enclosure, and the smaller subchamber is coupled to the region outside of the enclosure via the larger subchamber.

In dual-chamber systems, subchambers are coupled to each other or to regions outside the enclosure either by ports or by equivalent drone cones. This results in further increases in low frequency sensitivity and peak output when compared to the simpler ported enclosure system.

SUMMARY OF THE INVENTION

It is an important object of this invention to provide an improved dual-chamber ported loudspeaker system.

According to the invention, there is enclosure means for supporting at least one loudspeaker driver means for converting electrical energy into acoustic energy. There is dividing means for dividing the enclosure means into at least first and second subchambers having smaller and larger volumes, respectively. The dividing means preferably comprises means for supporting the loudspeaker driver means and coacting therewith to separate the first and second subchambers. There are at least first and second port means in said first and second subchambers respectively for providing first and second acoustical masses respectively. The first port means directly couples the first subchamber to the region outside the enclosure, and the second port means couples the second subchamber to the first subchamber.

Preferably, the invention radiates insignificant acoustical energy spectral components above a predetermined bass frequency, preferably no higher than 300 Hz, so that human auditory apparatus cannot easily localize on the enclosure means.

Numerous other features, objects and advantages of the invention will become apparent from the following specification when read in connection with the accompanying drawing in which:

Figure 1A:
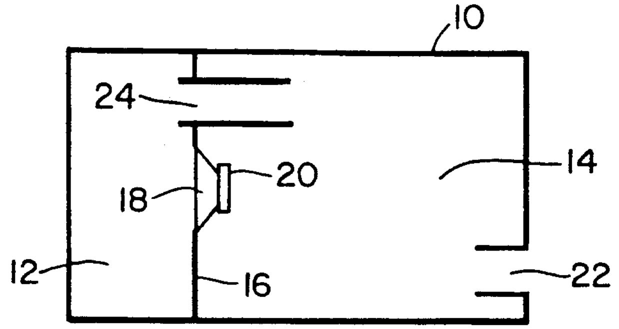
Fig 1A (PRIOR ART)
FIG. 1A is a diagrammatic representation of a prior art loudspeaker system.

With reference now to the drawing and more particularly FIG. 1 thereof, there is shown a diagrammatic representation of a prior art loudspeaker system having an enclosure 10 of rectangular cross section divided into two subchambers 12 and 14 by a dividing member 16. Dividing member 16 is formed with an opening 18 which exposes chamber 12 to the front surface of the cone of a loudspeaker driver 20. The back surface of driver 20 is exposed to subchamber 14. Port tube 22 couples the interior of subchamber 14 to the region outside of enclosure 10. Port tube 24 couples the interior of subchamber 12 to the region outside of enclosure 10 via subchamber 14. Subchamber 12 has a substantially smaller volume than subchamber 14.

Figure 1B:
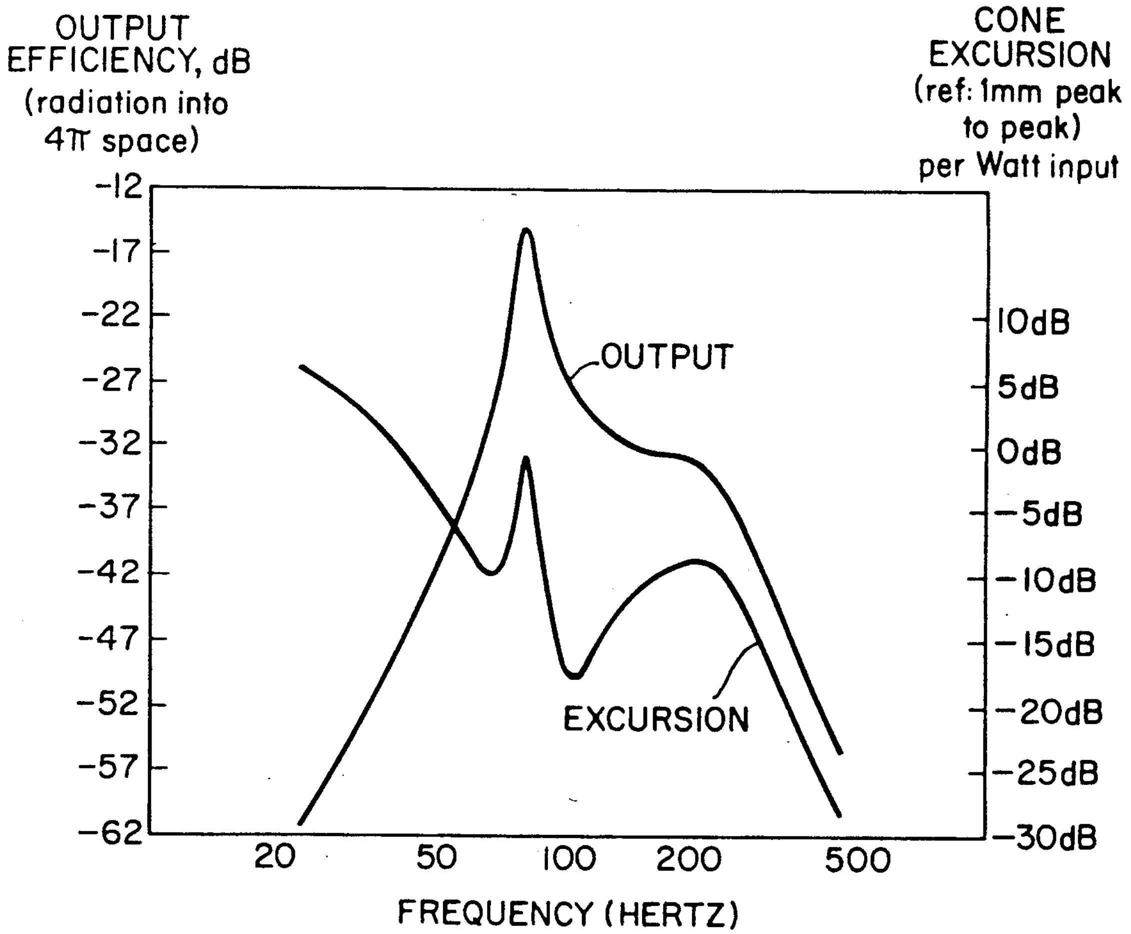
Fig. 1B (PRIOR ART)
FIG. 1B is a graphical representation of power output and cone excursion of the system of FIG. 1A.

Referring to FIG. 1B, there is shown a graphical representation of cone excursion and output power as a function of frequency for the prior art system shown in FIG. 1A. The output power curve shows that the prior art system has a resonance in the passband substantially 15 dB higher than the response in the remainder of the passband.

Figure 2A:
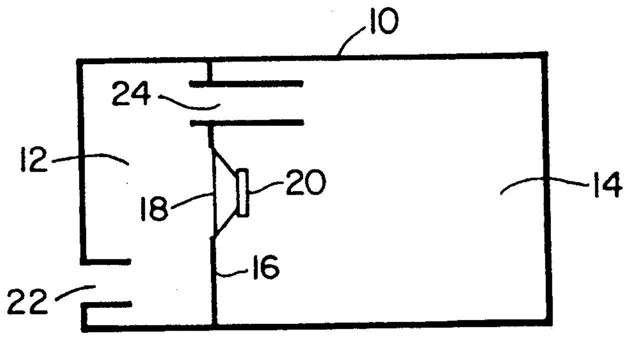
FIG. 2A is a diagrammatic representation of an embodiment of the invention.

Referring to FIG. 2A, there is shown a diagrammatic representation of an embodiment of the invention comprising an enclosure 10 of rectangular cross section divided into two subchambers 12 and 14 by a dividing member 16. Dividing member 16 is formed with an opening 18 which exposes chamber 12 to the front surface of the cone of a loudspeaker driver 20. The back surface of driver 20 is exposed to subchamber 14. Port tube 22 couples the interior of subchamber 12 to the region outside of enclosure 10. Port tube 24 couples the interior of subchamber 14 to the region outside of enclosure 10 via subchamber 12. Subchamber 12 has a substantially smaller volume than subchamber 14.

Figure 2B:
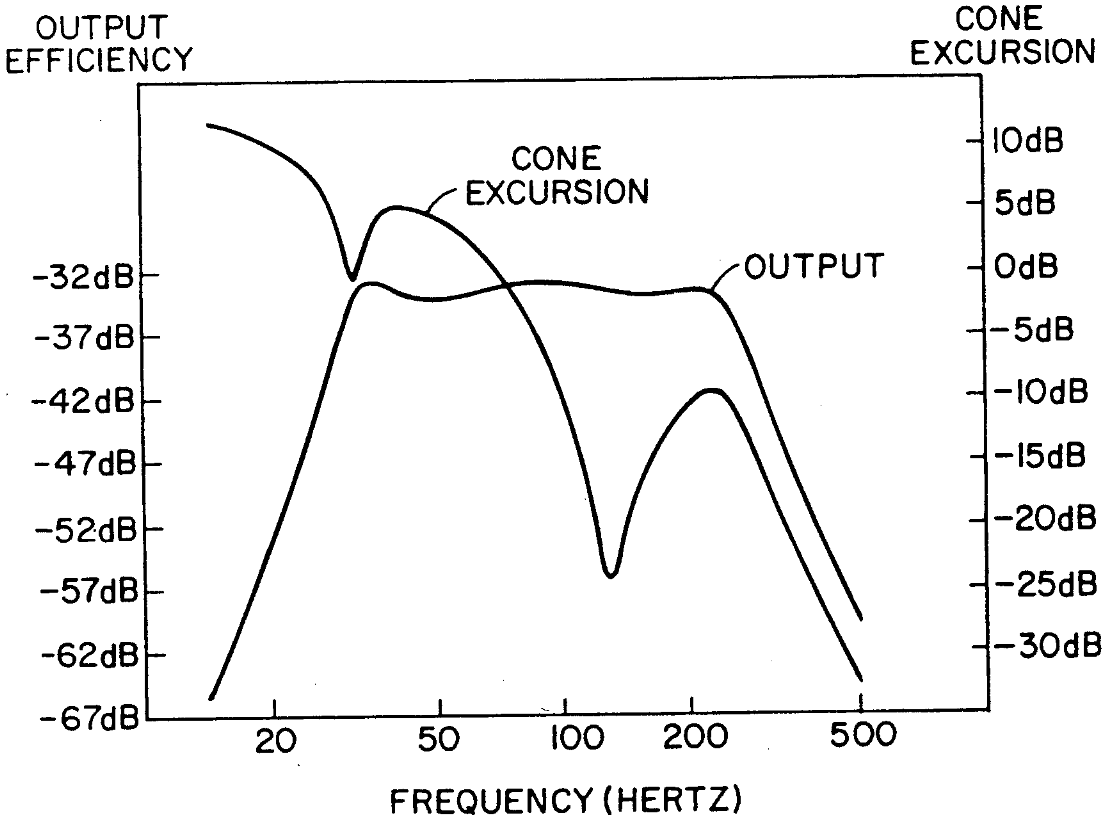
FIG. 2B is a graphical representation of power output and cone excursion of the system of FIG. 2B.

Referring to FIG. 2B, there is shown a graphical representation of cone excursion as a function of frequency for the embodiment of the invention shown in FIG. 2B. The output power curve shows a smooth response throughout the passband, without the resonance seen in the prior art system.

Figure 3:
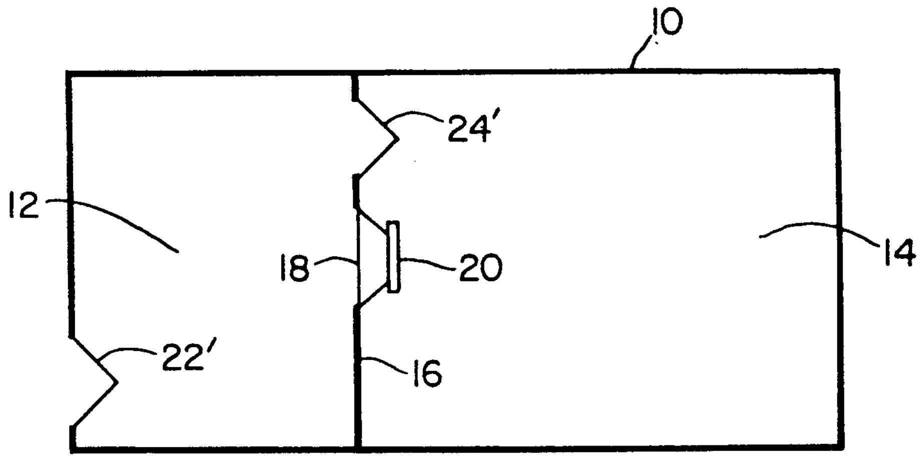
FIG. 3 is a diagrammatic representation of an alternative embodiment of the invention with drone cones.

A preferred embodiment of the invention employs the dimensions and parameters given below for the various elements:

Resistance of Voice Coil=4 ohms;

Flux Density in Motor Structure Magnetic Gap Multiplied by Length of Wire in Magnetic Gap=8.7 Webers/m;

Cone+Voice Coil Mass (=Moving Mass)=0.02 kg;

Driver (Woofer) Free Air Resonance Frequency=50 Hz;

Cone Area=0.026m$^2$ (Approx. 8 inch diameter woofer);

Small Subchamber Volume=0.0063m$^3$ (approx 380 in$^3$);

Large Subchamber Volume=0.0224 m$^3$ (approx 1370 in$^3$);

Acoustic Mass of Small Subchamber Port (Connecting to Exterior of Box)=70 kg/m$^4$ (approx. 0.006 m$^2$ area by 0.3 m long);

Acoustic Mass of Port Between Subchambers=80 kg/m$^4$ (approx. 0.006 m$^2$ area by 0.35 m long);

A number of variations may be practiced within the principles of the invention. For example, the driver could be coupled to additional subchambers. The passive radiators may be embodied by port tubes as shown in FIG. 2A, by "drone cones" 22', 24' as shown in FIG. 3, or other passive radiating means. The single woofer may be replaced by multiple transducers to achieve desired total area, motor force and/or power handling capabilities.

There has been described apparatus and techniques for providing flatter output response of loudspeakers in the bass region. It is evident that, those skilled in the art may now make numerous other modifications of and departures from the specific apparatus and techniques herein disclosed without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. An improved loudspeaker system comprising:

electroacoustic transducing means having a vibratable cone, enclosure means having an interior for supporting said electroacoustic transducing means for converting an input electrical signal into a corresponding acoustic output signal and adjacent to a region outside said enclosure means, dividing means coacting with said electroacoustic transducing means for dividing the interior of said enclosure means into first and second subchambers, said first subchamber being smaller in volume than said second subchamber, a first surface of said electroacoustic transducing means contacting said first subchamber and a second surface of said electroacoustic transducing means contacting said second subchamber, first and second passive radiating means each characterized by acoustic mass, said first passive radiating means directly coupling said first subchamber to the region outside said enclosure means, said second passive radiating means coupling said second subchamber to the region outside said enclosure means through said first subchamber.

2. An improved loudspeaker in accordance with claim 1 wherein said passive radiating means are port tubes.

3. An improved loudspeaker system in accordance with claim 1 wherein said passive radiating means are drone cones.

4. An improved loudspeaker system in accordance with claim 1 wherein the volumes of said subchambers and the acoustic masses of said passive radiating means establish a frequency response of said enclosure so that said passive radiating means radiate only bass acoustic spectral components below a bass frequency sufficiently low so that human auditory apparatus cannot easily localize on said enclosure means.

5. An improved loudspeaker system in accordance with claim 4 wherein said bass frequency is at least as low as 300 Hz.

6. An improved loudspeaker in accordance with claim 4 wherein said passive radiating means are port tubes.

7. An improved loudspeaker system in accordance with claim 4 wherein said passive radiating means are drone cones.

8. An improved loudspeaker in accordance with claim 5 wherein said passive radiating means are port tubes.

9. An improved loudspeaker system in accordance with claim 5 wherein said passive radiating means are drone cones.

* * * * *